(12) United States Patent
Yoon et al.

(10) Patent No.: US 9,356,168 B2
(45) Date of Patent: May 31, 2016

(54) METHOD OF MANUFACTURING CI(G)S NANO PARTICLES FOR MANUFACTURING LIGHT ABSORPTION LAYER AND CI(G)S NANO PARTICLES MANUFACTURED USING THE SAME

(71) Applicant: LG CHEM, LTD., Seoul (KR)

(72) Inventors: Taehun Yoon, Daejeon (KR); Seokhee Yoon, Daejeon (KR); Seokhyun Yoon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/588,864

(22) Filed: Jan. 2, 2015

(65) Prior Publication Data
US 2015/0118473 A1 Apr. 30, 2015

Related U.S. Application Data

(63) Continuation of application No. PCT/KR2014/006231, filed on Jul. 11, 2014.

(30) Foreign Application Priority Data

Jul. 19, 2013 (KR) .......................... 10-2013-0085340

(51) Int. Cl.
H01L 31/032 (2006.01)
C01B 19/00 (2006.01)

(52) U.S. Cl.
CPC .......... *H01L 31/0322* (2013.01); *C01B 19/002* (2013.01); *C01B 19/004* (2013.01); *C01B 19/007* (2013.01); *C01P 2002/72* (2013.01); *C01P 2002/85* (2013.01); *C01P 2004/03* (2013.01); *C01P 2004/62* (2013.01); *C01P 2004/64* (2013.01); *Y02E 10/541* (2013.01)

(58) Field of Classification Search
None
See application file for complete search history.

(56) References Cited

U.S. PATENT DOCUMENTS

| | | |
|---|---|---|
| 2008/0092954 A1 | 4/2008 | Choi |
| 2009/0280598 A1 | 11/2009 | Curtis et al. |
| 2009/0280624 A1 | 11/2009 | Curtis et al. |
| 2011/0076798 A1 | 3/2011 | Calzia et al. |
| 2012/0280185 A1 | 11/2012 | Liao |

FOREIGN PATENT DOCUMENTS

| | | |
|---|---|---|
| CN | 10-2923763 A | 2/2013 |
| JP | 2009-514993 A | 4/2009 |
| JP | 2009-530497 A | 8/2009 |
| JP | 2010-155730 A | 7/2010 |
| JP | 2013-064106 A | 4/2013 |
| KR | 10-2007-0027433 A | 3/2007 |
| KR | 10-2012-0075827 A | 7/2012 |
| WO | 2012-077242 A1 | 6/2012 |

OTHER PUBLICATIONS

Written Opinion for PCT/KR2014/006231 filed on Jul. 11, 2014.

*Primary Examiner* — Seahvosh Nikmanesh

(57) ABSTRACT

Disclosed are a method of preparing CI(G)S nano particles forming a light absorption layer of solar cells, including dissolving at least one Group VI source selected from the group consisting of compounds comprising sulfur (S), selenium (Se), or a combination thereof, and an indium (In) salt in a solvent to prepare a first solution, reacting the first solution to form first precursor particles, dissolving a copper (Cu) salt in a solvent to prepare a second solution, mixing the second solution with the first solution in which the first precursor is formed to manufacture a mixture and purifying the synthesized CI(G)S nano particles after synthesizing the CI(G)S nano particles by reacting the mixture, and CI(G)S nano particles manufactured using the same.

17 Claims, 16 Drawing Sheets

EDX SPECTRUM & LINE SCAN PROFILE FOR CIGS-S26 PARTICLE No. 2

METHOD OF MANUFACTURING CI(G)S NANO PARTICLES FOR MANUFACTURING LIGHT ABSORPTION LAYER AND CI(G)S NANO PARTICLES MANUFACTURED USING THE SAME

TECHNICAL FIELD

The present invention relates to a method of manufacturing CI(G)S nano particles for manufacturing a light absorption layer and CI(G)S nano particles manufactured using the same. More particularly, the present invention relates to a method of manufacturing CI(G)S nano particles forming a light absorption layer of a solar cell, including dissolving at least one Group VI source selected from a Group consisting of compounds including sulfur (S), selenium (Se), or a combination thereof, and an indium (In) salt in a solvent to prepare a first solution; reacting the first solution to form first precursor particles; dissolving a copper (Cu) salt in a solvent to prepare a second solution; mixing the second solution with the first solution, in which the first precursor is formed, to manufacture a mixture; and purifying the synthesized CI(G)S nano particles after synthesizing the CI(G)S nano particles by reaction of the mixture, and CI(G)S nano particles manufactured using the same.

BACKGROUND ART

Recently, people are more concerned with environmental problems and depletion of natural sources and thereby, interest in solar cells as an alternative energy source which does not cause environmental pollution is growing. Solar cells are classified into silicon solar cells, thin film-type compound solar cells, layered-type solar cells and the like. Among these solar cells, silicon semiconductor solar cells have been studied the most widely.

However, since silicon solar cells are indirect transition semiconductors, light absorption coefficients of which are lower than those of direct transition semiconductors, silicon solar cells cannot efficiently absorb photons, compared to direct transition semiconductors. Thus, silicon solar cells require a wider space charge region than direct transition semiconductors. In addition, to prevent recombination of electrons and holes, which are generated due to extended carrier life, in a space charge region, high purity Si is essentially required and, as such, high-priced, high level and complex process technologies, which consist of plural steps, and a high vacuum thin film process are required. When high purity single crystal Si is used, solar cells exhibit high efficiency. However, production costs of such a high purity single crystal Si are high and thereby, to reduce production costs, polycrystalline Si or amorphous Si, which exhibit low efficiency, are used. Since such polycrystalline Si or amorphous Si has low photoelectric conversion efficiency, when used for a long time, a problem such as deterioration may occur.

Therefore, to improve the problems of silicon solar cells, thin film type compound solar cells are recently studied and developed.

Among thin film type compound semiconductors, $Cu(In_{1-x}Ga_x)(Se_yS_{1-y})$ (CI(G)S), which is a Group I-III-VI compound included in ternary compounds, has a direct transition type energy band gap of 1 eV or more and high light absorption coefficient. In addition, the $Cu(In_{1-x}Ga_x)(Se_yS_{1-y})$ (CI(G)S) is very stable electro-optically. Thus, the $Cu(In_{1-x}Ga_x)(Se_yS_{1-y})$ (CI(G)S) is an ideal material for a light absorption layer of solar cells.

CI(G)S based solar cells are manufactured by forming a light absorption layer having a thickness of several microns. As methods of manufacturing a light absorption layer, there are an evaporation method which does not require a precursor, and sputtering and electrodeposition methods which form a CI(G)S thin film through thermal treatment after forming a thin film with a precursor. In addition, an ink coating method, in which thermal treatment is conducted after coating a precursor material under non-vacuum, was recently introduced. By using the ink coating method among the above methods, process costs may be reduced and a large area may be manufactured homogenously. Thus, research into the ink coating method is actively being carried out. As a precursor in the ink coating method, a variety of compound or metal types such as metal chalcogenide compounds, bimetallic metal particles, metal salts, metal oxides, or the like may be used.

In particular, when a metal chalcogenide compound is used as a precursor, a Cu—Se compound and In—Se compound are mixed or $CuInSe_2$ particles are synthesized. When particles are mixed, a partially heterogeneous coating layer may be produced. When $CuInSe_2$ is used, a long time is required for particle growth.

Meanwhile, since bimetallic metal particles are synthesized with Cu—In alloy, partial heterogeneity may be solved, and reaction time is reduced due to fast particle growth. However, in a selenium (Se) or sulfur (S) atmosphere, a layer with a partial Se or S deficit may be formed. In addition, when a metal salt is coated, a coating layer having high layer density may be produced, whereas due to anions included in a salt, a layer is damaged or organic residues may be formed.

Therefore, there is a high need to develop a technology for precursor nano particles which may form a highly efficient light absorption layer, a coating property of which is improved and thereby layer density of which is increased.

DISCLOSURE

Technical Problem

Therefore, the present invention has been made to solve the above problems and other technical problems that have yet to be resolved.

As a result of a variety of intensive studies and various experiments, the inventors of the present invention, first, formed first precursor particles including indium (In) and a Group VI element, and selectively further including gallium (Ga) and then confirmed that, when CI(G)S nano particles are synthesized by adding a copper (Cu) salt, a particle composition may be freely controlled and globular particles having a predetermined diameter are synthesized homogenously, thus completing the present invention.

Technical Solution

In accordance with one aspect of the present invention, provided is a method of manufacturing CI(G)S nano particles forming a light absorption layer of solar cells, the method including:

(i) dissolving at least one Group VI source selected from the group consisting of compounds including sulfur (S), selenium (Se), or a combination thereof, and an indium (In) salt in a solvent to prepare a first solution;

(ii) reacting the first solution to form first precursor particles;

(iii) dissolving a copper (Cu) salt in a solvent to prepare a second solution;

(iv) mixing the second solution with the first solution in which the first precursor is formed, to manufacture a mixture; and (v) purifying the synthesized CI(G)S nano particles after synthesizing the CI(G)S nano particles by reacting the mixture.

Inventors of the present application realized that when a Cu—Se compound and In—Se compound mixed with a conventional metal chalcogenide compound are used, these compounds are not mixed homogenously and thereby, it is difficult to control a composition. In addition, since the compounds are present in a bulk type, formation of globular particles having a certain diameter is difficult.

Therefore, as a result of in-depth study, inventors of the present invention confirmed that when CI(G)S nano particles were manufactured by adding a copper (Cu) salt instead of a Cu—Se(S) compound to In—Se(S) compound, Cu ions move to a channel of an In—Se(S) compound and thereby Cu ions are homogenously dispersed in entire In—Se(S) compound particles maintaining structure of an In—Se(S) compound, and accordingly, composition control is easy and globular particles having a predetermined diameter may be easily manufactured.

Therefore, in one embodiment, the synthesized CI(G)S nano particles may be globular particles, in which copper (Cu) ions migrate to channels of amorphous first precursor particles, having an average diameter of 30 to 200 nm, more particularly globular particles having an average diameter of 50 to 150 nm.

CI(G)S nano particles having an average diameter of less than 30 nm, outside the ranges, are not preferable since a long time is required for particle growth. CI(G)S nano particles having an average diameter of greater than 200 nm are also not preferable since a coating layer of such particles is not dense and after thermal treatment, cracks or voids are frequently formed, resulting in low quality layers.

Here, the first precursor particles are amorphous. The CI(G)S nano particles to which copper (Cu) ions are migrated are amorphous or some of the CI(G)S nano particles to which copper (Cu) ions are migrated may be a crystal form due to Cu ions migrated to amorphous first precursor particles.

Hereinafter, a method of manufacturing the CI(G)S nano particles according to the present invention will be described in detail. As described above, the present invention first forms first precursor particles and in step (i), a first solution including 0.5 to 2 mol of a Group VI source based on 1 mole of indium in a first solution of step (i) may be prepared.

When a Group VI source is included in an amount of less than 0.5 mol, which is below the above range, in a first solution, Group VI elements are not sufficient and thereby, a layer in which Group VI elements are deficient may partially be formed. Whereas, when a Group VI source is included in an amount of greater than 0.5 mol, some of the Group VI source which does not react with metal salts remains and thus S or Se is precipitated. The precipitated S or Se reacts with Cu ions and thereby a Cu—Se(S) compound is formed. As a result, heterogeneity of a composition is induced and thereby efficiency of solar cells is reduced.

A reaction of step (ii) to form the first precursor particles may be carried out by maintaining a first solution for 1 to 4 hours at 130 to 170° C., depending on desired particle sizes.

A reaction at a temperature higher than the above temperature range is not preferable since precipitation of Se or S constituting first precursor particles, In—Se(S) particles, is more progressed and thereby, a ratio of Se or S in In—Se(S) particles is reduced.

Here, the first precursor particles may be synthesized by a polyol reaction. In one embodiment, a solvent of the first solution and second solution may be a polyol solvent.

The polyol solvent may, for example, be at least one selected from the group consisting of ethylene glycol, diethylene glycol, diethylene glycol ethyl ether, diethylene glycol butyl ether, triethylene glycol, tetraethylene glycol, poly(ethylene glycol) (molecular weight: 200~100,000), poly(ethylene glycol)diacrylate, poly(ethylene glycol)dibenzonate, dipropylene glycol, dipropylene glycol and glycerol, and particularly may be ethylene glycol, diethylene glycol, triethylene glycol or tetraethylene glycol.

The first precursor particles manufactured as described above may be an In—Se, In—S, or In—Se—S compound. In one embodiment, a gallium (Ga) salt may further added in the first solution, and in this case, first precursor particles may be an In—Ga—Se, In—Ga—S, or In—Ga—Se—S compound.

Meanwhile, as described above, since the CI(G)S nano particles according to the present invention are manufactured by mixing separately the second solution including a copper (Cu) salt after manufacturing the first precursor particles which does not include a copper (Cu) salt, a composition ratio of indium (In) to a Group VI element as well as composition of copper (Cu) also may be controlled easily. Concretely, as a preferable composition ratio of metals used in the CI(G)S light absorption layer, copper (Cu), and indium (In) or indium (In) and gallium (Ga) are included in the CI(G)S light absorption layer in a molar ratio of 0.2~1:1. In one embodiment, in the mixture of step (iv) of the present invention, 0.2 to 1 mol of copper (Cu) may be included based on 1 mol of indium (In) or indium (In) and gallium (Ga) 1.

When 1 mol or more of copper (Cu), which is below the above composition, based on 1 mol of In+Ga is included in the mixture of step (iv), phases such as $Cu_2Se$ (S) besides CI(G)S nano particles remain inside a layer and function as a shunting site between two electrodes of solar cells, resulting in quality decline of the thin film solar cell.

The reaction of step (v) to form the CI(G)S nano particles may be carried out by maintaining a mixture of the first solution and second solution for 2 to 5 hours at 150 to 190° C., considering a minimum time and a desired particle size such that copper (Cu) ions are uniformly infiltrated through channels of the first precursor particles.

Meanwhile, the metal salt and Group VI source used in the manufacturing method of the present invention are not limited so long as the metal salt and Group VI source include elements below. For example, the salt as a source of copper (Cu), indium (In), and gallium (Ga) may be at least one type selected from the group consisting of chloride, nitrate, nitrite, sulfate, acetate, sulfite, acetylacetonate and hydroxide. The Group VI source may be at least one selected from the group consisting of $Na_2Se$, $K_2Se$, $Ca_2Se$, $(CH_3)_2Se$, $SeO2$, $SeCl_4$, $H_2SeO_3$, $Na_2S$, $K_2S$, $Ca_2S$, $(CH_3)_2S$, $H_2SO_4$, $NH_2SO_3H$, $(NH_2)_2SO_2$, $Na_2S_2O_3$ and hydrates thereof, may be at least one selected from the group consisting of thiourea, thioacetamide, selenourea, and selenous acid, as a organic material.

In addition, the present invention provides CI(G)S nano particles manufactured according to the present invention and a thin film including a light absorption layer based on the CI(G)S nano particles.

A thin film including the light absorption layer is manufactured by coating ink, which is prepared by dispersing CI(G)S nano particles according to the present invention in a solvent, on a substrate on which an electrode is formed, and then performing drying and thermal treatment.

Here, a coating layer forming the light absorption layer may have a thickness of 0.5 to 3 µm, more particularly 2 to 3 µm.

When the thickness of the thin film is less than 0.5 µm, the density and amount of the light absorption layer are insufficient and thus desired photoelectric efficiency may not be obtained. On the other hand, when the thickness of the thin film exceeds 3.0 µm, movement distances of carriers increase and, accordingly, there is an increasing probability of recombination, which results in reduced efficiency. In a specific embodiment, the solvent used in preparation of the ink is not particularly limited so long as the solvent is a general organic solvent and may be one organic solvent selected from among alkanes, alkenes, alkynes, aromatics, ketones, nitriles, ethers, esters, organic halides, alcohols, amines, thiols, carboxylic acids, phosphines, phosphites, phosphates, sulfoxides, and amides or a mixture of at least one organic solvent selected therefrom.

In particular, the alcohols may be at least one mixed solvent selected from among ethanol, 1-propanol, 2-propanol, 1-pentanol, 2-pentanol, 1-hexanol, 2-hexanol, 3-hexanol, heptanol, octanol, ethylene glycol (EG), diethylene glycol monoethyl ether (DEGMEE), ethylene glycol monomethyl ether (EGMME), ethylene glycol monoethyl ether (EGMEE), ethylene glycol dimethyl ether (EGDME), ethylene glycol diethyl ether (EGDEE), ethylene glycol monopropyl ether (EGMPE), ethylene glycol monobutyl ether (EGMBE), 2-methyl-1-propanol, cyclopentanol, cyclohexanol, propylene glycol propyl ether (PGPE), diethylene glycol dimethyl ether (DEGDME), 1,2-propanediol (1,2-PD), 1,3-propanediol (1,3-PD), 1,4-butanediol (1,4-BD), 1,3-butanediol (1,3-BD), α-terpineol, diethylene glycol (DEG), glycerol, 2-(ethylamino)ethanol, 2-(methylamino)ethanol, and 2-amino-2-methyl-1-propanol.

The amines may be at least one mixed solvent selected from among triethyl amine, dibutyl amine, dipropyl amine, butylamine, ethanolamine, diethylenetriamine (DETA), triethylenetetramine (TETA), triethanolamine, 2-aminoethyl piperazine, 2-hydroxyethyl piperazine, dibutylamine, and tris(2-aminoethyl)amine.

The thiols may be at least one mixed solvent selected from among 1,2-ethanedithiol, pentanethiol, hexanethiol, and mercaptoethanol.

The alkanes may be at least one mixed solvent selected from among hexane, heptane, and octane.

The aromatics may be at least one mixed solvent selected from among toluene, xylene, nitrobenzene, and pyridine.

The organic halides may be at least one mixed solvent selected from among chloroform, methylene chloride, tetrachloromethane, dichloroethane, and chlorobenzene.

The nitriles may be acetonitrile.

The ketones may be at least one mixed solvent selected from among acetone, cyclohexanone, cyclopentanone, and acetyl acetone.

The ethers may be at least one mixed solvent selected from among ethyl ether, tetrahydrofuran, and 1,4-dioxane.

The sulfoxides may be at least one mixed solvent selected from among dimethyl sulfoxide (DMSO) and sulfolane.

The amides may be at least one mixed solvent selected from among dimethyl formamide (DMF) and n-methyl-2-pyrrolidone (NMP).

The esters may be at least one mixed solvent selected from among ethyl lactate, γ-butyrolactone, and ethyl acetoacetate.

The carboxylic acids may be at least one mixed solvent selected from among propionic acid, hexanoic acid, meso-2,3-dimercaptosuccinic acid, thiolactic acid, and thioglycolic acid.

However, the solvents are only given as an example, and embodiments of the present invention are not limited thereto.

In some cases, an additive may be further added to the ink.

The additive may, for example, be at least one selected from the group consisting of a dispersant, a surfactant, a polymer, a binder, a crosslinking agent, an emulsifying agent, an anti-forming agent, a drying agent, a filler, a bulking agent, a thickening agent, a film conditioning agent, an antioxidant, a fluidizer, a leveling agent, and a corrosion inhibitor. In particular, the additive may be at least one selected from the group consisting of polyvinylpyrrolidone (PVP), polyvinylalcohol, Anti-terra 204, Anti-terra 205, ethyl cellulose, and DispersBYK110.

The coating may, for example, be any one selected from the group consisting of wet coating, spray coating, spin-coating, doctor blade coating, contact printing, top feed reverse printing, bottom feed reverse printing, nozzle feed reverse printing, gravure printing, micro gravure printing, reverse micro gravure printing, roll coating, slot die coating, capillary coating, inkjet-printing, jet deposition, and spray deposition.

The thermal treatment may be performed at a temperature of 400 to 900° C.

Since the CI(G)S nano particles according to the present invention include Group VI elements, the thermal treatment may be reduced to 5 to 10 minutes and the Group VI elements still have identical reactivity.

Furthermore, the present invention provides a thin film solar cell manufactured using the thin film.

A method of manufacturing a thin film solar cell is known in the art and thus a detailed description thereof will be omitted herein.

BRIEF DESCRIPTION OF THE DRAWINGS

The above and other objects, features and other advantages of the present invention will be more clearly understood from the following detailed description taken in conjunction with the accompanying drawing, in which.

BEST MODE

Figure 1:
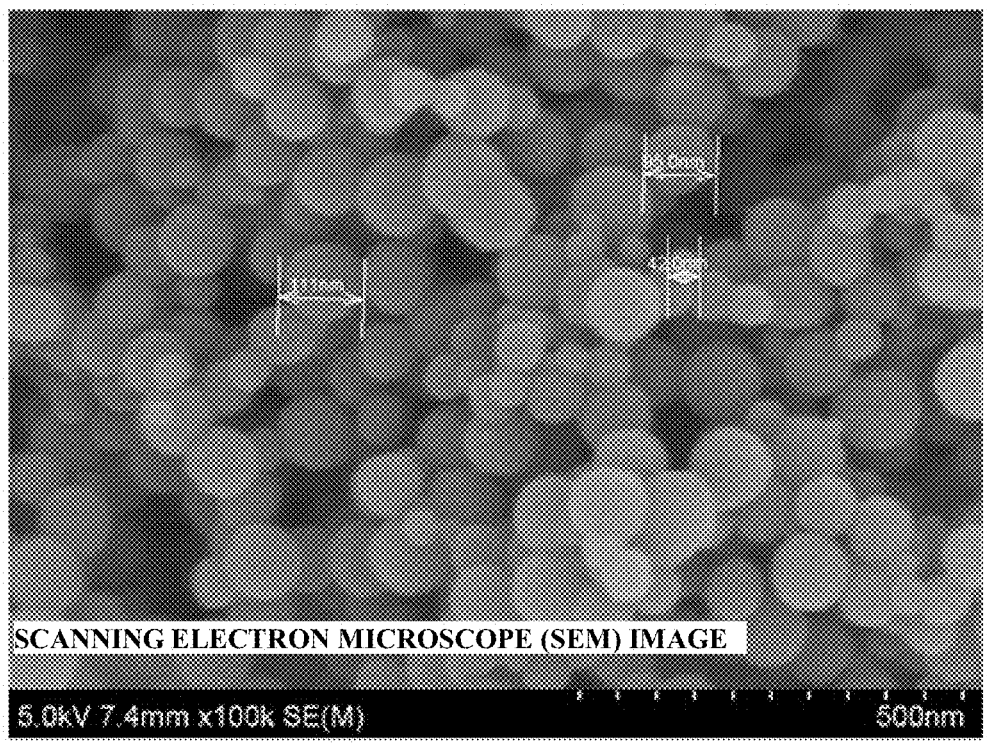
FIG. 1 is a scanning electron microscope (SEM) image of CI(G)S nano particles formed according to Example 1.
Figure 2:
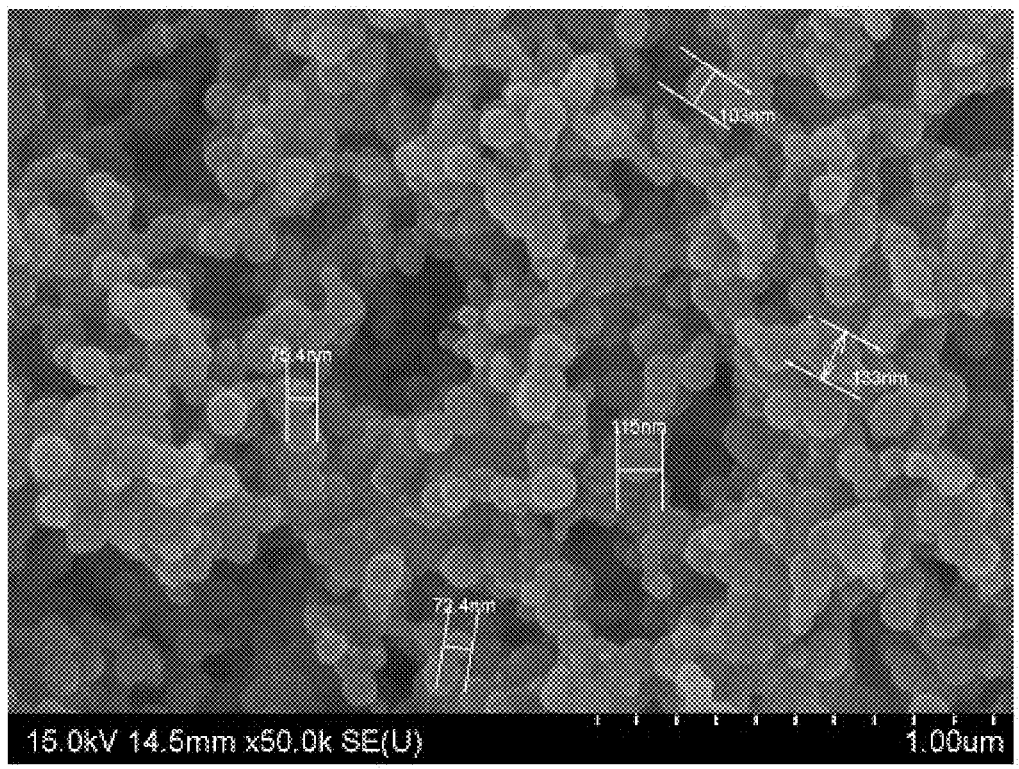
FIG. 2 is a scanning electron microscope (SEM) image of CI(G)S nano particles formed according to Example 2.

Now, the present invention will be described in more detail with reference to the following examples. These examples are provided only for illustration of the present invention and should not be construed as limiting the scope and spirit of the present invention.

Example 1

After dissolving 5 mmol of indium nitrate aqueous solution and 10 mmol of acelic acid in 70 ml of ethylene glycol and mixing, the mixture was heated to 150° C. and reacted for 2 hours. After adding 50 ml of an ethylene glycol, in which 5 mmol of Cu(II) nitroxide is dissolved, to the mixture, this resulted mixture was heated to 150° C. and maintained for 4 hours. After completing the reaction, the mixture was purified by centrifugation to manufacture CI(G)S nano particles having, approximately, a $CuInSe_2$ composition in which Cu ions migrated amorphous $InSe_2$ particles.

Example 2

After dissolving 7 mmol of indium nitrate aqueous solution, 3 mmol of gallium nitrate aqueous solution and 20 mmol of acelic acid in 150 ml of ethylene glycol and mixing, the mixture was heated to 150° C. and reacted for 1 hours. After adding 50 ml of ethylene glycol, in which 10 mmol of a Cu(II) nitroxide is dissolved, to the mixture, it was maintained to 150° C. for 2 hours and then to 170° C. for 1 hours. After completing the reaction, the mixture was purified by centrifugation to manufacture CI(G)S nano particles having, approximately, a $CuIn(Ga)Se_2$ composition in which Cu ions migrated amorphous In(Ga)Se particles.

Example 3

After dissolving 7 mmol of indium nitrate aqueous solution, 3 mmol of gallium nitrate aqueous solution and 20 mmol of acelic acid in 150 ml of ethylene glycol and mixing, the mixture was heated to 150° C. and reacted for 2 hours. After adding 20 ml of ethylene glycol, in which 10 mmol of a Cu(II) nitroxide is dissolved, to the mixture, the resulted mixture was maintained to 150° C. for 2 hours. After completing the reaction, the mixture was purified by centrifugation to manufacture CI(G)S nano particles having, approximately, a $CuIn(Ga)Se_{1.5}$ composition in which Cu ions migrated amorphous In(Ga)Se particles.

Example 4

After dissolving 5 mmol of indium nitrate aqueous solution and 10 mmol of acelic acid in 100 ml of ethylene glycol and mixing, the mixture was heated to 150° C. and reacted for 4 hours. After adding 50 ml of ethylene glycol, in which 5 mmol of a Cu(II) nitroxide is dissolved, to the mixture, the resulted mixture was maintained to 170° C. for 4 hours. After completing the reaction, the mixture was purified by centrifugation to manufacture CI(G)S nano particles having, approximately, a $CuInSe_2$ composition in which Cu ions migrated amorphous $InSe_2$ particles.

Comparative Example 1

5 mmol of $Cu(NO_3)_2$, 5 mmol of $In(NO_3)_3$ and 10 mmol of acelic acid were mixed in 120 ml of ethylene glycol. The mixture was inserted into an autoclave and reacted by stirring at 210° C. for 15 hours. Prepared particles were purified by centrifugation to manufacture CI(G)S nano particles having, approximately, a $CuInSe_2$ composition.

Comparative Example 2

7.5 mmol of $Cu(NO_3)_2$, 10.5 mmol of $In(NO_3)_3$, 4.5 mmol of $Ga(NO_3)_3$ and 15 mmol of acelic acid were mixed in 100 ml of ethylene glycol. The mixture was reacted by stirring at 170° C. for 6 hours. Prepared particles were purified by centrifugation to manufacture CI(G)S nano particles having, approximately, a $Cu_{0.5}In_{0.7}Ga_{0.3}Se$ composition.

Experimental Example 1

Scanning electron microscope images analyzing nano particles formed in Examples 1 to 4 and Comparative Examples 1 and 2 are shown in FIGS. 1, 2 and 5 to 8.

Referring to FIGS. 1, 2, 5 and 6, the CI(G)S nano particles manufactured in Example 1 have an average diameter of 100 nm, the CI(G)S nano particles manufactured in Example 2 have an average diameter of 70 to 130 nm, the CI(G)S nano particles manufactured in Example 3 have an average diameter of 60 nm, and the CI(G)S nano particles manufactured in Example 4 have an average diameter of 30 to 80 nm. Therefore, all nano particles of the examples are in a diameter range of 30 to 200 nm and have a globular type.

Figure 7:
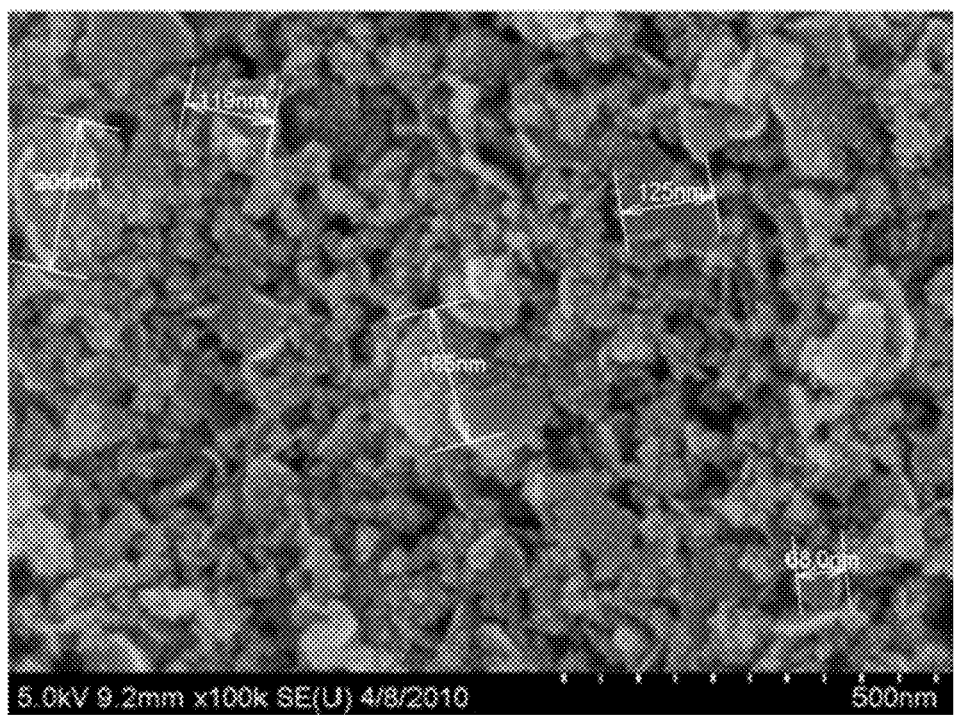
FIG. 7 is a scanning electron microscope (SEM) image of CI(G)S nano particles formed according to Comparative Example 1.
Figure 8:
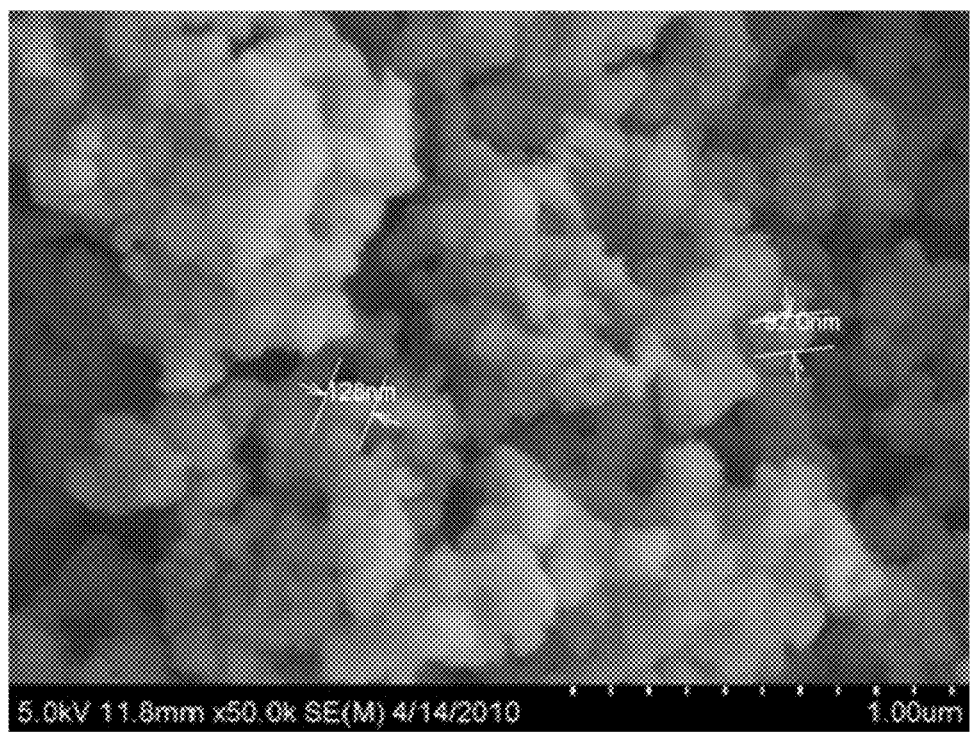
FIG. 8 is a scanning electron microscope (SEM) image of CI(G)S nano particles formed according to Comparative Example 2.

On the other hand, referring to FIGS. 7 and 8, the average diameters of the CI(G)S nano particles manufactured in Comparative Examples 1 and 2 have a large deviation. In addition, the CI(G)S nano particles are not a globular type.

Figure 3:
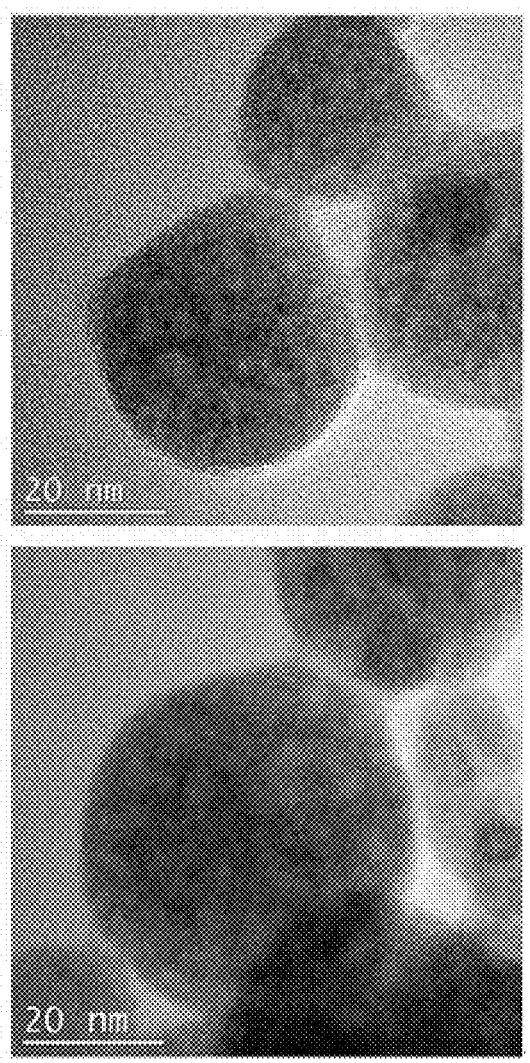
FIG. 3 is a transmission electron microscope (TEM) image of CI(G)S nano particles formed according to Example 2.
Figure 4:
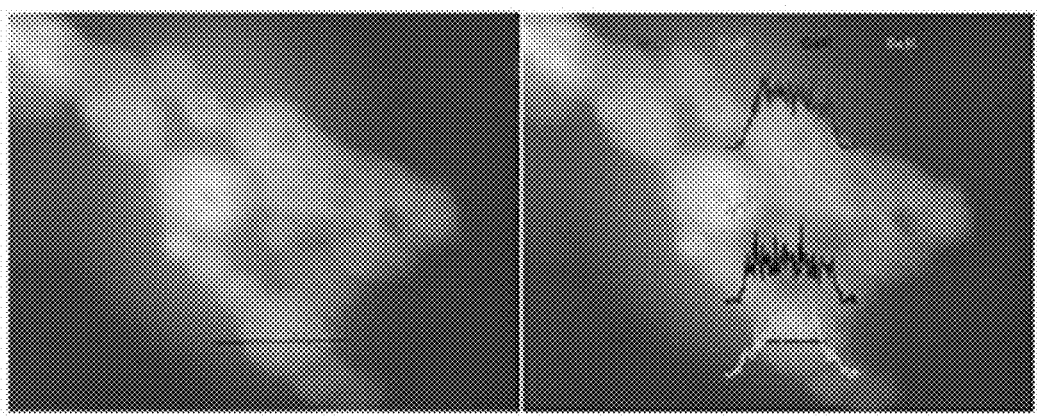
FIG. 4 is an image showing results of EDX analysis of CI(G)S nano particles formed according to Example 2.
Figure 4:
Figure 5:
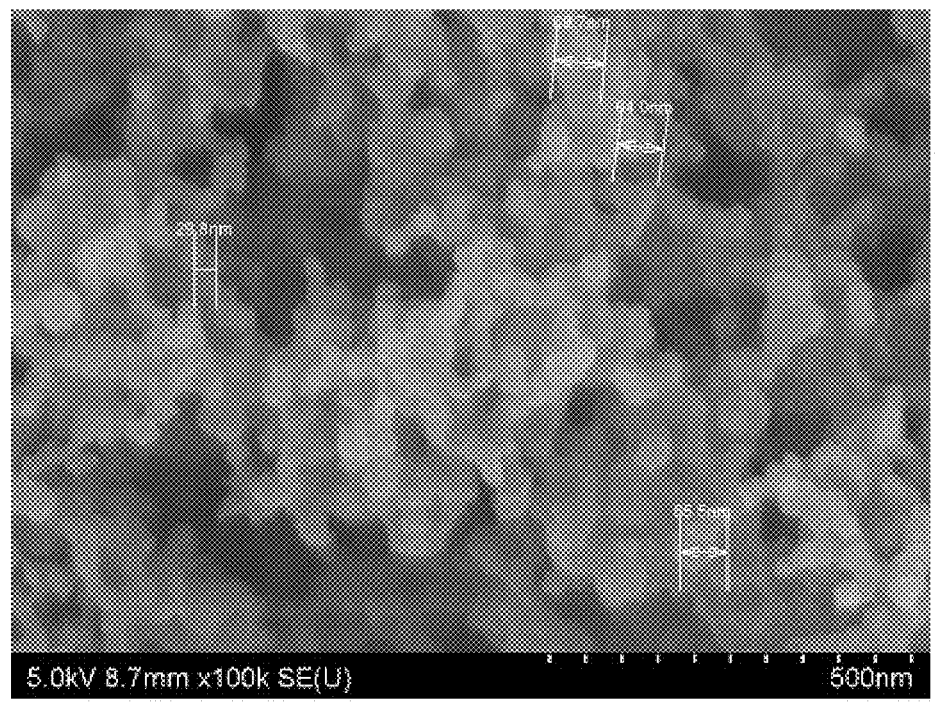
FIG. 5 is a scanning electron microscope (SEM) image of CI(G)S nano particles formed according to Example 3.
Figure 6:
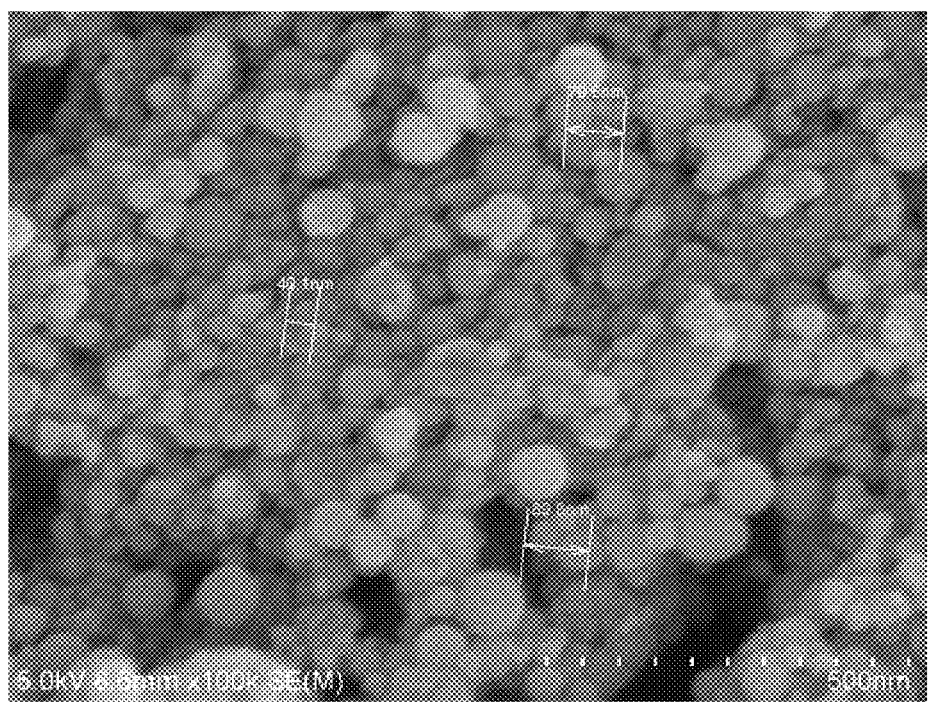
FIG. 6 is a scanning electron microscope (SEM) image of CI(G)S nano particles formed according to Example 4.

In addition, to observe in detail the structures of the nano particles according to the present invention, transmission electron microscope (TEM) and energy dispersive X-ray (EDX) images analyzing the nano particles formed in Example 2 are shown in FIG. 3 and FIG. 4.

Referring to FIGS. 3 and 4, it is confirmed that some of the nano particles according to the present invention are formed by new crystallization of small crystal particles of approximately 10 nm formed by Cu ions migrated to inner space of approximately 50 nm in amorphous particles and in amorphous particles of approximately 50 nm, In and Ga are overall rich and all of Cu, In, Ga and Se are contained homogenously.

Example 5

Thin Film Manufacture

Figure 9:
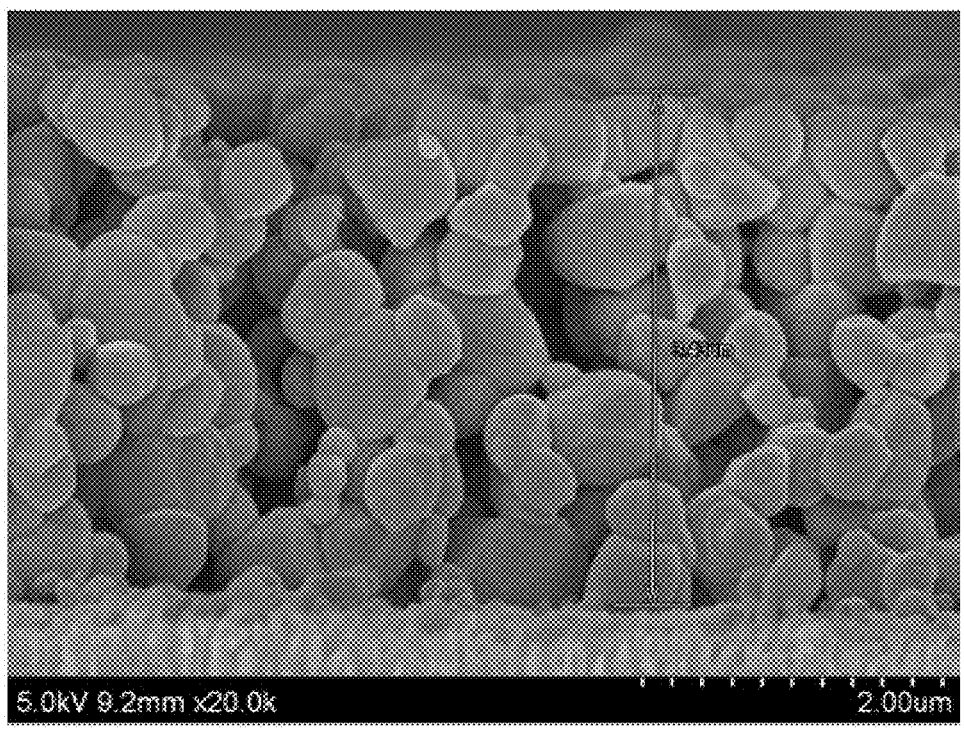
FIG. 9 is an SEM image showing a thin film prepared according to Example 5.
Figure 10:
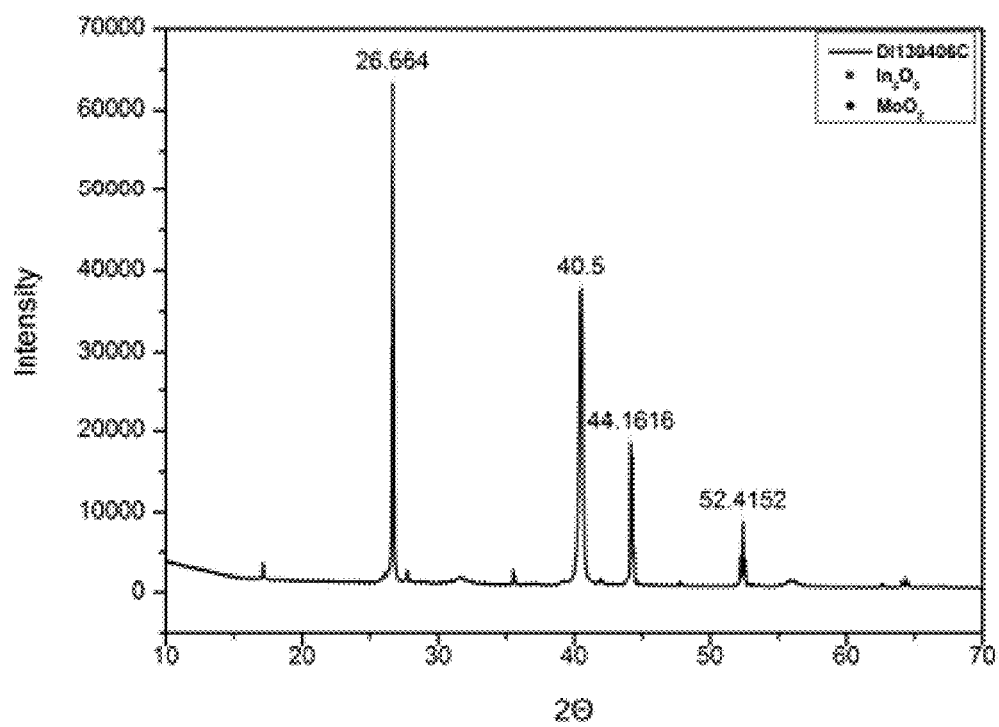
FIG. 10 is an XRD graph showing a thin film prepared according to Example 5.

The CI(G)S nano particles according to Example 1 were dispersed in a concentration of 20% in a mixture of alcohol-based solvents to prepare ink. After depositing Mo on a glass substrate, the glass substrate was coated with the ink, resulting in a coating layer to manufacture a CI(G)S thin film. The coated glass substrate was dried up to 200° C. and then thermal treated for 10 minutes at 530° C. under an Se atmosphere, resulting in a CI(G)S thin film. A section shape and an XRD phase of the obtained thin film are shown in FIGS. 9 and 10, respectively.

Example 6

Thin Film Manufacture

Figure 11:
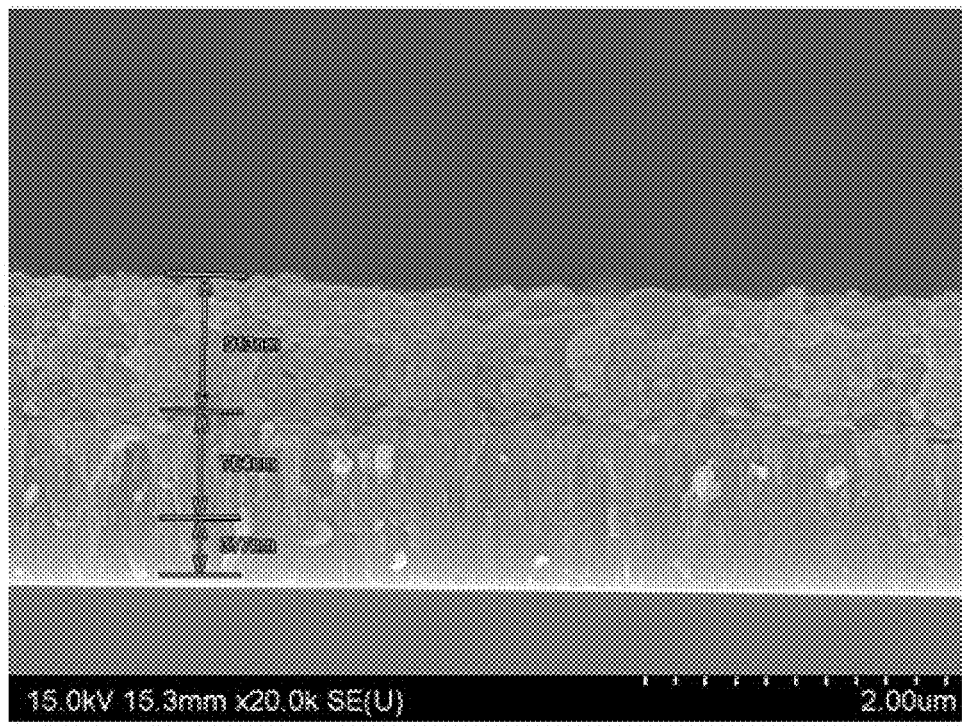
FIG. 11 is an SEM image showing a thin film prepared according to Example 6.
Figure 12:
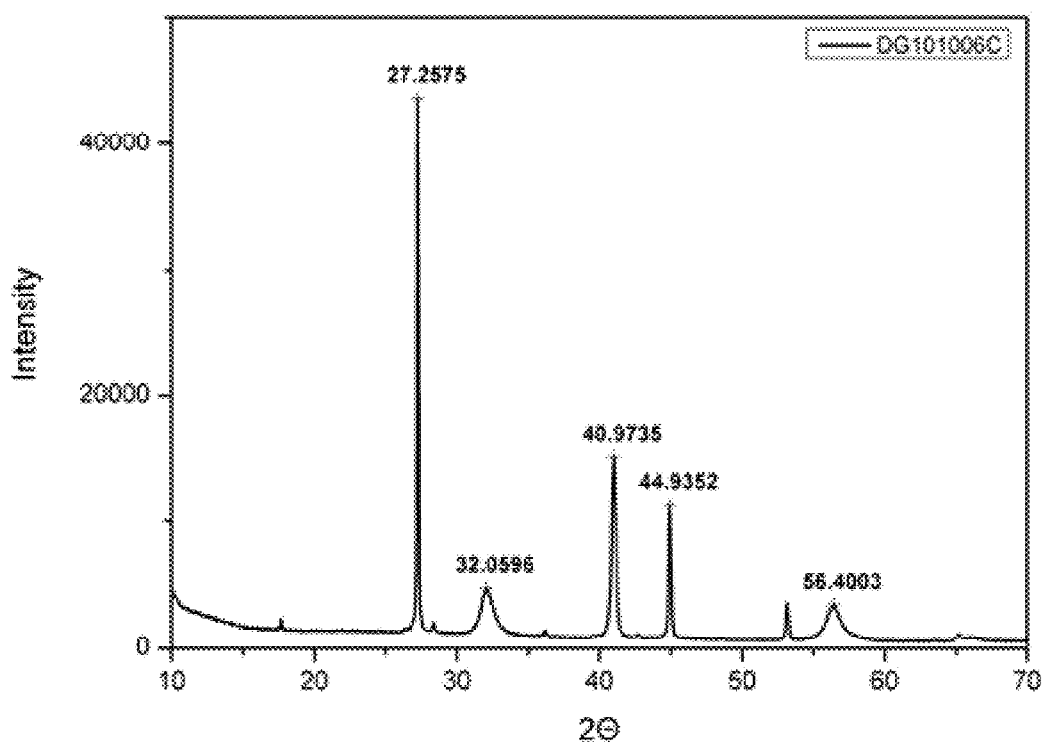
FIG. 12 is an XRD graph showing a thin film prepared according to Example 6.

The CI(G)S nano particles according to Example 2 were dispersed in a concentration of 25% in a mixture of alcohol-based solvents to prepare ink. After depositing Mo on a glass substrate, the glass substrate was coated with the ink, resulting in a coating layer to manufacture a CI(G)S thin film. The coated glass substrate was dried up to 220° C. and then thermal treated for 5 minutes at 550° C. under an Se atmosphere, resulting in a CI(G)S thin film. A section shape and an XRD phase of the obtained thin film are shown in FIGS. 11 and 12, respectively.

Example 7

Thin Film Manufacture

Figure 13:
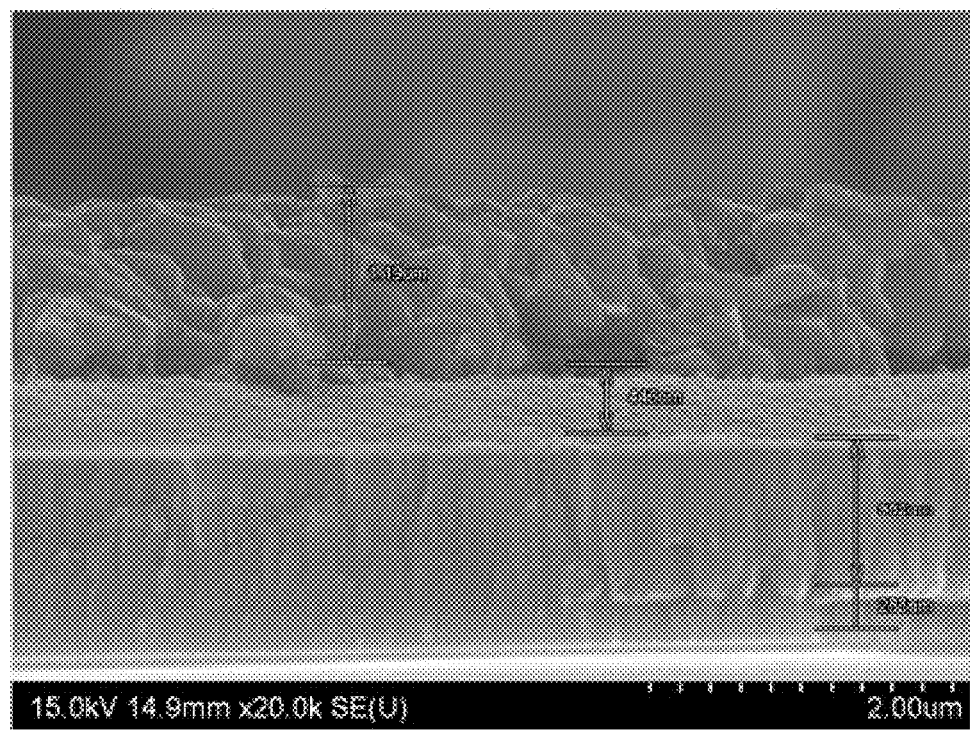
FIG. 13 is an SEM image showing a thin film prepared according to Example 7.
Figure 14:
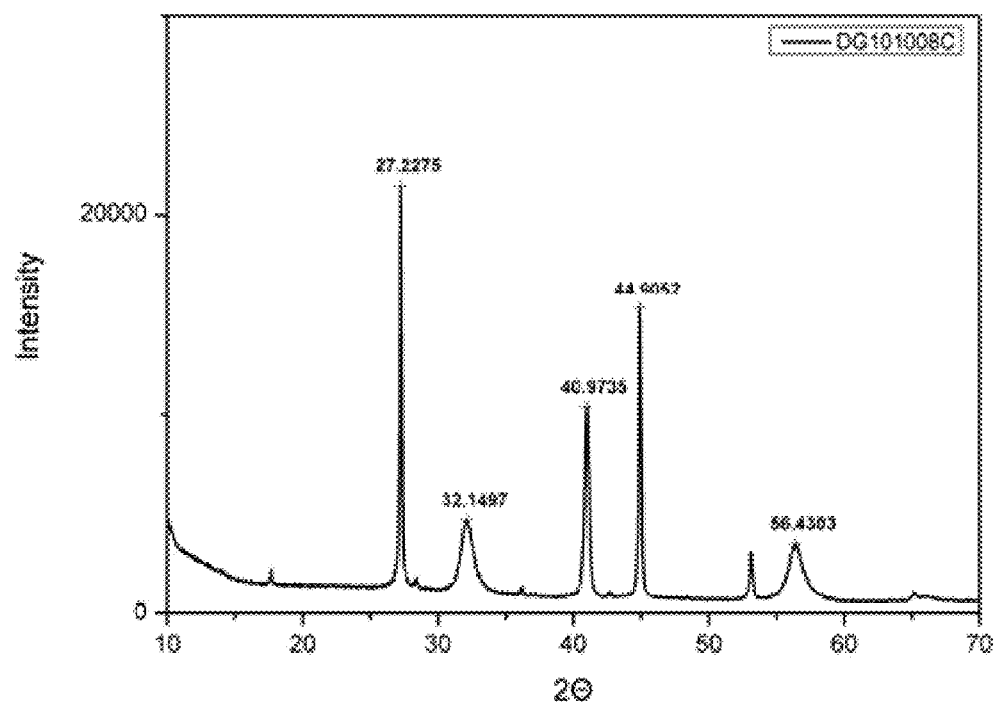
FIG. 14 is an XRD graph showing a thin film prepared according to Example 7.

The CI(G)S nano particles according to Example 3 were dispersed in a concentration of 25% in a mixture of alcohol-based solvents to prepare ink. After depositing Mo on a glass substrate, the glass substrate was coated with the ink, resulting in a coating layer to manufacture a CI(G)S thin film. The coated glass substrate was dried up to 260° C. and then thermal treated for 5 minutes at 640° C. under an Se atmosphere, resulting in a CI(G)S thin film. A section shape and an XRD phase of the obtained thin film are shown in FIGS. 13 and 14, respectively.

Example 8

Thin Film Manufacture

The CI(G)S nano particles according to Example 4 were dispersed in a concentration of 22% in a mixture of alcohol-based solvents to prepare ink. After depositing Mo on a glass substrate, the glass substrate was coated with the ink, resulting in a coating layer to manufacture a CI(G)S thin film. The coated glass substrate was dried up to 200° C. and then thermal treated for 5 minutes at 575° C. under an Se atmosphere, resulting in a CI(G)S thin film.

Example 9

Thin Film Manufacture $Cu_{0.2}InSe$ and $Cu_2In$ particles were synthesized in a same manner as Example 1. Here, a composition of Cu:In in the $Cu_{0.2}InSe$ was changed to 0.2:1. The $Cu_{0.2}InSe$ and $Cu_2In$ particles were mixed and then dispersed in a concentration of 25% in a mixture of alcohol-based solvents to prepare ink. The ink was coated on a substrate obtained by depositing Mo on a glass substrate, resulting in a coating layer to manufacture a CI(G)S thin film. The coating layer was dried up to 200° C. and then thermal treated for 5 minutes at 575° C. under Se atmosphere, resulting in a CI(G)S thin film.

Comparative Example 3

Thin Film Manufacture

The CI(G)S nano particles synthesized in Comparative Example 2 were dispersed in a concentration of 16.5% in a mixture of alcohol-based solvents to prepare ink. The ink was coated on a substrate obtained by depositing Mo on a glass substrate, resulting in a coating layer to manufacture a CI(G)S thin film. The coating layer was dried up to 260° C. and then thermal treated for 5 minutes at 640° C. under Se atmosphere, resulting in a CI(G)S thin film. A section shape and XRD phase of the obtained CI(G)S thin film were shown in FIGS. 15 and 16, respectively.

Example 10

Manufacture of Thin Film Solar Cell

After manufacturing a CdS buffer layer on the CI(G)S thin film obtained from Example 6 using a CBD method, ZnO and AlZnO were sequentially deposited on the Cds buffer layer. Thereafter, an Al electrode was raised on the deposited layer with e-beam, resulting in a cell having Voc of 0.34 V, Jsc of 4.05 mAcm², fill factor of 25.73%, and efficiency of 0.36%.

Example 11

Manufacture of Thin Film Solar Cell

After manufacturing a CdS buffer layer on the CI(G)S thin film obtained from Example 7 using a CBD method, ZnO and AlZnO were sequentially deposited on the Cds buffer layer. Thereafter, an Al electrode was raised on the deposited layer with e-beam, resulting in a cell having Voc of 0.04 V, Jsc of 4.94 mAcm², fill factor of 24.91%, and efficiency of 0.05%.

Example 12

Manufacture of Thin Film Solar Cell

After manufacturing a CdS buffer layer on the CI(G)S thin film obtained from Example 9 using a CBD method, ZnO and AlZnO were sequentially deposited on the Cds buffer layer. Thereafter, an Al electrode was raised on the deposited layer with e-beam, resulting in a cell having Voc of 0.24 V, Jsc of 23.15 mAcm², fill factor of 34.37%, and efficiency of 1.92%.

Experimental Example 1

Photoelectric efficiencies of CI(G)S based thin film solar batteries manufactured in Examples 10 to 12 were measured. Results are summarized in Table 1 below.

TABLE 1

|  | $J_{sc}$ (mA/cm²) | $V_{oc}$ (V) | FF (%) | Photoelectric efficiency (%) |
|---|---|---|---|---|
| Example 10 | 4.05 | 0.34 | 25.73 | 0.36 |
| Example 11 | 4.94 | 0.04 | 24.91 | 0.05 |
| Example 12 | 23.15 | 0.24 | 34.37 | 1.92 |

In Table 1, $J_{sc}$, which is a variable determining the efficiency of each solar cell, represents current density, $V_{oc}$ denotes an open circuit voltage measured at zero output current, the photoelectric efficiency means a rate of cell output according to irradiance of light incident upon a solar cell plate, and fill factor (FF) represents a value obtained by dividing a value obtained by multiplication of current density and voltage values at a maximum power point by a value obtained by multiplication of Voc by $J_{sc}$.

As shown in Table 1, it is confirmed that when the CI(G)S nano particles, to which copper (Cu) ions are migrated, manufactured according to the present invention were used in light absorption layer formation, current density and voltage were high.

The CI(G)S nano particles of FIGS. 1 to 8 do not have problems such as oxidation during thermal treatment or non-formation of a CI(G)S phase. In addition, since one CI(G)S nano particle of the present invention includes all metals and a Group VI element, a homogenous composition may be prepared. Furthermore, since the crystal particles of the CI(G)S nano particles are not identical to CI(G)S crystal particles, fast particle growth is exhibited. Therefore, the CI(G)S nano particles of the present invention have high current density and voltage.

Figure 15:
FIG. 15 is an SEM image showing a thin film prepared according to Comparative Example 3.
Figure 16:
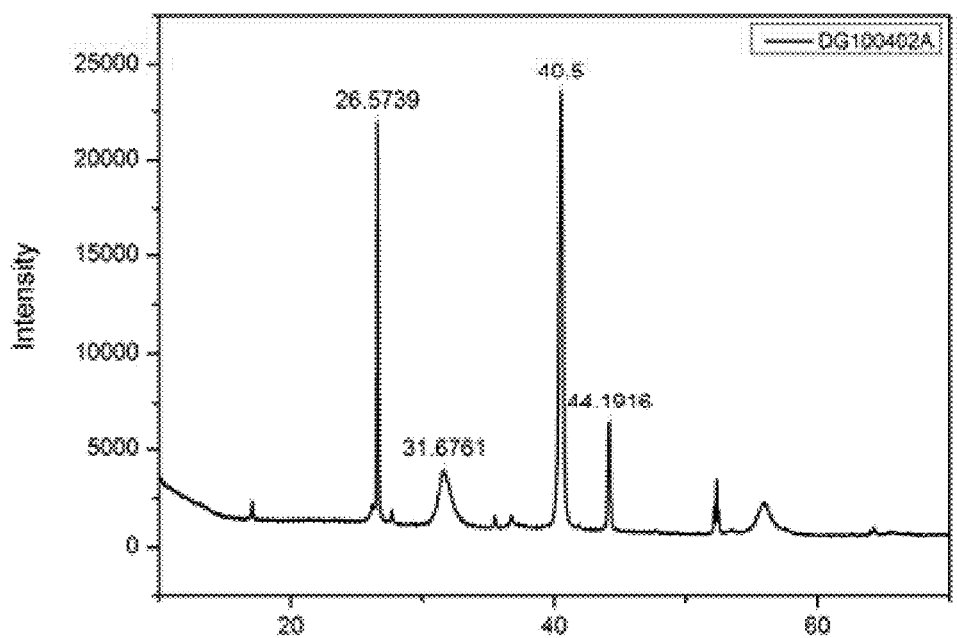
FIG. 16 is an XRD graph showing a thin film prepared according to Comparative Example 3.

Meanwhile, the CI(G)S particles used in the thin film of Comparative Example 3 have problems described above. Referring to FIG. 15 and FIG. 16, the layer density of the thin film is low and thin film quality is not high. Therefore, the thin film is not proper in manufacturing thin film solar cells and further, when solar cells with such a thin film are manufactured, photoelectric efficiency is extremely low.

Those skilled in the art will appreciate that various modifications, additions and substitutions are possible, without departing from the scope and spirit of the invention as disclosed in the accompanying claims.

INDUSTRIAL APPLICABILITY

As described above, a method of manufacturing CI(G)S nano particles according to the present invention may freely control a particle composition and synthesize homogenously globular particles having a predetermined diameter by first forming first precursor particles including indium (In) and a Group VI element and selectively, further including gallium (Ga), and then adding a copper (Cu) salt to the first precursor particles Accordingly, when a light absorption layer is manufactured using the CI(G)S nano particles, partial composition heterogeneity of a CI(G)S thin film may be solved. In addition, due to homogenous globular particles, the density of a coating layer is increased. Furthermore, using nano particles including the Group VI element, thermal treatment time in a thin film manufacture process may be reduced and a shortage phenomenon of the Group VI element may be solved.

The invention claimed is:

1. A method of preparing CI(G)S nano particles forming a light absorption layer of solar cells, the method comprising:
    dissolving at least one Group VI source selected from the group consisting of compounds comprising sulfur (S), selenium (Se), or a combination thereof, and an indium (In) salt in a solvent to prepare a first solution;
    reacting the first solution to form first precursor particles;
    dissolving a copper (Cu) salt in a solvent to prepare a second solution;
    mixing the second solution with the first solution in which the first precursor is formed to manufacture a mixture; and
    purifying the synthesized CI(G)S nano particles after synthesizing the CI(G)S nano particles by reacting the mixture.

2. The method according to claim 1, wherein a solvent of each of the first solution and second solution is a polyol solvent.

3. The method according to claim 2, wherein the polyol solvent is at least one selected form the group consisting of ethylene glycol, diethylene glycol, diethylene glycol ethyl ether, diethylene glycol butyl ether, triethylene glycol, tetraethylene glycol, poly(ethylene glycol) (molecular weight: 200 to 100,000), poly(ethylene glycol)diacrylate, poly(ethylene glycol)dibenzonate), dipropylene glycol, dipropylene glycol and glycerol.

4. The method according to claim 1, wherein the first solution further comprises a gallium (Ga) salt.

5. The method according to claim 1, wherein the salt is at least one selected from the group consisting of chloride, nitrate, nitrite, sulfate, acetate, sulfite, acetylacetonate and hydroxide.

6. The method according to claim 1, wherein the Group VI source is at least one selected from the group consisting of $Na_2Se$, $K_2Se$, $Ca_2Se$, $(CH_3)_2Se$, $SeO_2$, $SeCl_4$, $H_2SeO_3$, $Na_2S$, $K_2S$, $Ca_2S$, $(CH_3)_2S$, $H_2SO_4$, $NH_2SO_3H$, $(NH_2)_2SO_2$, $Na_2S_2O_3$ and hydrates thereof.

7. The method according to claim 1, wherein the Group VI source is at least one selected from the group consisting of thiourea, thioacetamide, selenourea, and selenous acid.

8. The method according to claim 1, wherein the first solution of the dissolving comprises 0.5 to 2 mol of a Group VI source based on 1 mol of indium.

9. The method according to claim 1, wherein the mixture of the mixing comprises 0.2 to 1 mol of copper (Cu) based on 1 mol of indium (In).

10. The method according to claim 1, wherein the synthesized CI(G)S nano particles are globular particles having an average diameter of 30 to 200 nm.

11. The method according to claim 10, wherein the CI(G)S nano particles have an average diameter of 50 nm to 150 nm.

12. The method according to claim 1, wherein the synthesized CI(G)S nano particles comprise copper (Cu) ions migrated to channels of amorphous first precursor particles.

13. The method according to claim 1, wherein the first precursor particles are amorphous, and the CI(G)S nano particles comprising migrated copper (Cu) ions are amorphous or some of the CI(G)S nano particles are a crystalline due to Cu ions migrated to the amorphous first precursor particles.

14. CI(G)S nano particles manufactured using the method according to claim 1.

15. A thin film comprising a light absorption layer based on the CI(G)S nano particles according to claim 14.

16. The thin film according to claim 15, wherein the light absorption layer is formed to a thickness of 2 to 3 μm.

17. A thin film solar cell manufactured using the thin film according to claim 15.

* * * * *